(12) United States Patent
To et al.

(10) Patent No.: US 7,760,323 B2
(45) Date of Patent: Jul. 20, 2010

(54) EXPOSURE APPARATUS AND METHOD OF MANUFACTURING DEVICE

(75) Inventors: Hiromitsu To, Utsunomiya (JP); Hidekazu Furumoto, Kawachi-machi (JP)

(73) Assignee: Canon Kabushiki Kaisha, Tokyo (JP)

( * ) Notice: Subject to any disclaimer, the term of this patent is extended or adjusted under 35 U.S.C. 154(b) by 222 days.

(21) Appl. No.: 11/356,798

(22) Filed: Feb. 17, 2006

(65) Prior Publication Data

US 2006/0209274 A1 Sep. 21, 2006

(30) Foreign Application Priority Data

Mar. 4, 2005 (JP) ............... 2005-060652

(51) Int. Cl.
*G03B 27/52* (2006.01)
(52) U.S. Cl. .......................... 355/30; 359/509
(58) Field of Classification Search .................... 355/30, 355/53, 67; 430/5; 359/509
See application file for complete search history.

(56) References Cited

U.S. PATENT DOCUMENTS

| | | | | |
|---|---|---|---|---|
| 5,559,584 A | * | 9/1996 | Miyaji et al. ................... 355/73 |
| 5,995,263 A | * | 11/1999 | Tokuda et al. ............. 359/196.1 |
| 5,997,963 A | * | 12/1999 | Davison et al. .............. 427/582 |
| 6,542,220 B1 | * | 4/2003 | Schrijver et al. ............... 355/53 |
| 6,555,834 B1 | * | 4/2003 | Loopstra ................... 250/492.3 |
| 6,731,371 B1 | * | 5/2004 | Shiraishi ....................... 355/30 |
| 6,762,412 B1 | | 7/2004 | Akagawa |
| 6,970,228 B1 | * | 11/2005 | Aoki et al. ..................... 355/30 |
| 7,106,412 B2 | * | 9/2006 | De Bokx et al. .............. 355/30 |
| 2002/0000519 A1 | * | 1/2002 | Tsukamoto ............... 250/492.1 |
| 2002/0018190 A1 | * | 2/2002 | Nogawa et al. ................ 355/30 |
| 2002/0191163 A1 | * | 12/2002 | Hasegawa et al. ............. 355/30 |
| 2003/0169407 A1 | * | 9/2003 | Hasegawa et al. ............. 355/30 |
| 2005/0030496 A1 | * | 2/2005 | Chibana et al. ............... 355/30 |
| 2005/0157278 A1 | * | 7/2005 | Owa et al. ..................... 355/30 |
| 2005/0254025 A1 | * | 11/2005 | Lallemant et al. ............. 355/30 |

FOREIGN PATENT DOCUMENTS

| | | |
|---|---|---|
| JP | 2001-028331 A | 1/2001 |
| JP | 2004-228497 | 12/2004 |
| WO | WO03/030229 | 4/2003 |
| WO | WO 03030229 A1 * | 4/2003 |

* cited by examiner

*Primary Examiner*—Edward J Glick
*Assistant Examiner*—Steven H Whitesell-Gordon
(74) *Attorney, Agent, or Firm*—Canon U.S.A., Inc. I.P. Division

(57) ABSTRACT

At least one exemplary embodiment is directed to an exposure apparatus for exposing a substrate to light through an original plate including a shield configured to surround an optical path space of the exposure apparatus where a gas supply system is configured to supply gas into the optical path space which is deflected by a rectifier to direct the flow outside of the optical path space.

7 Claims, 6 Drawing Sheets

EXPOSURE APPARATUS AND METHOD OF MANUFACTURING DEVICE

BACKGROUND OF THE INVENTION

1. Field of the Invention

The present invention relates to an exposure apparatus and a method of using an exposure apparatus for manufacturing a device, more particularly, although not exclusively, for manufacturing a semiconductor element.

2. Description of the Related Art

In a process for manufacturing a semiconductor device, such as an IC, an LSI, or a liquid crystal panel, a substrate (semiconductor wafer substrate or glass substrate) is subjected to various treatments. Among others, an exposure process for transferring a pattern is a key process in the manufacture of a semiconductor device. The exposure process is generally performed with an exposure apparatus (stepper, scanner, etc. . . . ).

A resist applied to a wafer is divided broadly into two types: a polymer film resist and a chemically amplified resist. In the polymer film resist, ionizing radiation (ultraviolet rays, X-rays, electron beam, etc. . . . ) can efficiently initiate a chemical reaction. In the chemically amplified resist, the exposure to light generates a catalyst (acid), which catalyzes image formation in a post-exposure bake (PEB). Since the image formation with the chemically amplified resist utilizes a catalyst, the sensitivity of the resist can easily be increased. Thus, the chemically amplified resist can have widely been used as a resist for an excimer laser.

However, a catalyst generated by the exposure diffuses into the air or the surface of a wafer. Thus, the post-exposure bake enhancing the catalytic action causes deterioration in the image profile. Thus, when the chemically amplified resist is used, chemical contamination due to a basic gas in the environmental atmosphere, such as amine or amide, can be prevented or reduced during the application of the resist, the exposure to light, and the post-exposure bake.

An exposure apparatus includes an illumination optical system, which irradiates a reticle (original plate) with light from a light source, and various optical elements, such as lenses and mirrors. A shorter wavelength of exposure light causes fogging of an optical element that is irradiated with the light or through which the light passes, undesirably decreasing the amount of light reaching a wafer. It is believed that the fogging is caused by an organic compound or ammonium sulfate $(NH_4)_2SO_4$. Exposure to light induces a photochemical reaction of an ammonium ion $(NH_4)^+$, a sulfate ion $(SO_4^{2-})$, compounds thereof, or an organic gas in the air, thus forming a deposit on the optical element.

As conventional countermeasures against lower solubility of the surface of a chemically amplified resist and the fogging of an optical element, an environmental chamber, which controls the temperature, the humidity, or dust around an exposure apparatus, is provided with an impurity filter to remove a substance in the atmosphere, such as a basic gas, a sulfuric acid gas, or an organic compound gas.

At the same time, components used in the environmental chamber are cleaned, for example, by washing. In addition, a lubricating agent that emits a smaller amount of such a gas component is selected. Furthermore, part of a space or the entire space around an optical path between a light source and a substrate to be treated is purged with a gas inert to exposure light.

Japanese Patent Laid-Open No. 2001-028331 discusses such a purge with an inert gas. This patent document focuses attention on a method for supplying an inert purge gas (nitrogen) into a casing of an optical device and aims to reduce contamination of an optical element, such as a lens, due to the inflow of the inert purge gas.

Specifically, the inert purge gas flowing from a gas supply unit at a predetermined flow rate is slowed down at the inlet of the casing and flows more slowly near the surface of the optical element. This allows the inert purge gas to diffuse in the casing more easily, preventing or reducing impurities in the inert purge gas from depositing on the optical element.

In Japanese Patent Laid-Open No. 2001-028331, a portion including a light source through projection optical system is hermetically sealed to isolate this portion from the outside air. This prevents or reduces impurities from depositing on the optical element in contact with the outside air.

Alternatively, a space between the light source and a wafer stage is hermetically sealed to isolate the space from the outside air. This also prevents or reduces impurities from depositing on the optical element.

However, such a hermetically sealed structure increases the size of the optical device and requires an opening and closing mechanism for sending in and taking out a mask (original plate) and a wafer (substrate). The opening and closing to achieve an appropriate purge decreases the operating rate.

Furthermore, purging of almost the entire device consumes a large amount of inert gas, increasing the running costs.

Japanese Patent Laid-Open No. 2001-028331 can achieve a primary object. That is, it can prevent or reduce impurities in a purge gas from intensively depositing on an optical element in a hermetically sealed casing. However, since the concentration of impurities in a purge gas and the flow rate of the purge gas are constant, the deposition of impurities cannot be reduced if impurities or a space containing impurities is exposed to light and the resulting photochemical reaction generates a deposit. Thus, it is difficult to reduce or prevent the fogging of an optical element.

Furthermore, even when the intensive deposition of impurities is prevented or reduced, deposition can occur at another portion. When the deposition of impurities occurs intensively at a certain portion, it is more effective to isolate this portion from the operating area of the optical system. However, in the structure according to the patent document, the deposition of impurities can occur on any optical element in a region to be purged and thereby decrease the transmittance of the contaminated optical element.

To avoid an increase in the size of an optical device, it is realistic to purge the optical device having a hermetically sealed structure and to prevent or reduce the fogging of an optical element in contact with the outside air by using an impurity filter installed in an environmental chamber. However, even when the impurity filter is installed in the environmental chamber, impurities may not be removed completely.

Furthermore, since the impurity filter can have a useful life depending on the amount of impurities to be removed, it needs laborious maintenance and additional running costs.

SUMMARY OF THE INVENTION

At least one exemplary embodiment is directed to an exposure apparatus and a method of using an exposure apparatus for manufacturing, an image sensor, a liquid crystal display element, a thin film magnetic head, or a micro device.

At least one exemplary embodiment is directed to an exposure apparatus for exposing a substrate to light through an original plate, the apparatus including: an optical system disposed on an optical path between a light source and the substrate; a casing configured to accommodate the optical system; a shield configured to surround an optical path space adjacent to an end face of the optical system accommodated in the casing; a gas supply system configured to supply gas into the optical path space surrounded by the shield from a first region of the shield toward a second region of the shield, the second region facing the first region; and a rectifier disposed in the second region and configured to deflect flow of the gas supplied by the gas supply system and to direct the flow outside of the shield.

At least one further exemplary embodiment is directed to a method of using an exemplary embodiment of an exposure apparatus including: exposing a substrate to light using the exemplary embodiment exposure apparatus; developing the exposed substrate; and processing the developed substrate to manufacture the device.

At least one exemplary embodiment is directed to a contamination reducing device, including: a shield, where the shield surrounds a first portion of an optical path space of an optical exposure apparatus; a gas injector system, where the gas injector system injets gas into the first portion, where the gas is one of He, N2, and filtered air, and the gas rate of the gas injector system is controlled by a first controller; and a gas intake system, where the gas intake system intakes a second portion of the gas injected into the first portion at an intake rate controlled by a second controller.

Further features of the present invention will become apparent from the following description of exemplary embodiments with reference to the attached drawings. In the description, reference is made to accompanying drawings, which form a part thereof, and which illustrate an example of the invention. Such example, however, is not exhaustive of the various exemplary embodiments of the invention.

BRIEF DESCRIPTION OF THE DRAWINGS

The accompanying drawings, which are incorporated in and constitute a part of the specification, illustrate embodiments of the invention.

DESCRIPTION OF THE EMBODIMENTS

The following description of at least one exemplary embodiment is merely illustrative in nature and is in no way intended to limit the invention, its application, or uses.

Processes, techniques, apparatus, and materials as known by one of ordinary skill in the relevant art may not be discussed in detail but are intended to be part of the enabling description where appropriate.

Notice that similar reference numerals and letters refer to similar items in the following figures, and thus once an item is defined in one figure, it may not be discussed for following figures.

First Exemplary Embodiment

Figure 6:
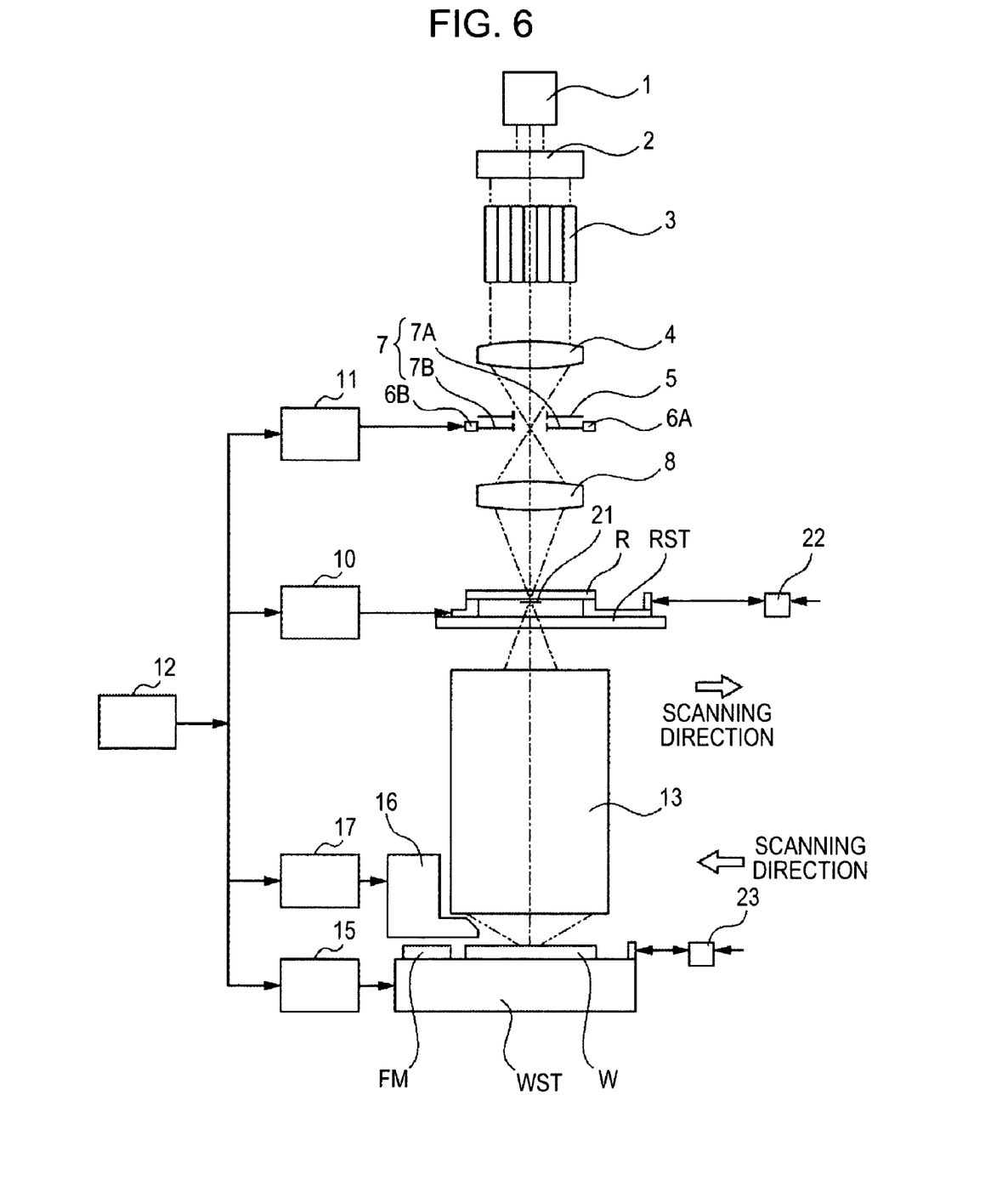
FIG. 6 is a schematic view of an exposure apparatus according to the first exemplary embodiment.

FIG. 6 illustrates a projection exposure apparatus according to this exemplary embodiment. A reticle R is illuminated at a consistent illuminance by light from a light source 1 via an illumination optical system including an optical system 2 for shaping illumination light through a relay lens system 8. A circuit pattern image of the reticle R is projected on a rectangular slit illumination region 21 and is then transferred through projection optical system 13 to a wafer W. The light source 1 can be many various types of light sources, for example a pulsed light source, an excimer laser, an F2 excimer laser, an ArF excimer laser, a KrF excimer laser, a metal vapor laser light source, a YAG laser harmonic generator, and a continuous light source (e.g., a combination of a mercury lamp and an elliptical reflector) and other light sources that are used to illuminate a reticle as known by one of ordinary skill in the relevant arts.

In a pulsed light source, on/off switching of the exposure is controlled by the electricity from a power supply for the pulsed light source. In a continuous light source, on/off switching of the exposure is controlled with a shutter in the optical system 2 for shaping illumination light. In this non-limiting exemplary embodiment, the projection exposure apparatus includes a moving blind (variable field stop) 7, as described below. Thus, on/off switching of the exposure can be controlled by the opening and closing of the moving blind 7.

In FIG. 6, the luminous flux of an illumination light from the light source 1 is adjusted to have a predetermined size with the optical system 2 for shaping the illumination light, which enters a fly-eye lens 3. Many secondary light sources are formed at the exit of the fly-eye lens 3. Illumination light from the secondary light sources is converged with a condenser lens 4 and reaches the moving blind (variable field stop) 7 through a fixed field stop 5. In FIG. 6, while the field stop 5 is placed closer to the condenser lens 4 than the moving blind 7 is, the field stop 5 can be placed closer to the relay lens system 8 than the moving blind 7 is.

The field stop 5 can have a rectangular slit opening. In the particular non limiting example described herein, the luminous flux from the field stop 5 can have a rectangular slit cross section. The luminous flux enters the relay lens system 8. The longitudinal direction of the slit is substantially perpendicular to the drawing. The relay lens system 8 generates conjugate points on the moving blind 7 and the surface of the reticle R to be patterned. The moving blind 7 is composed of two blades (screens) 7A and 7B that define the width in a scanning direction (+/−X direction) described below and two blades (not shown) that define the width in a non-scanning direction substantially perpendicular to the scanning direction. The blades 7A and 7B that define the width in a scanning direction are supported such that the blades 7A and 7B can independently be moved in the scanning direction with drives 6A and 6B, respectively. The two blades (not shown) that define the width in a non-scanning direction are also supported such that these two blades can independently be driven. In the slit illumination region 21 on the reticle R defined by the fixed field stop 5, only a desired exposure area defined by the moving blind 7 is irradiated with illumination light. The relay lens system 8 can be a bilateral telecentric optical system. The telecentricity is maintained in the slit illumination region 21 on the reticle R.

The reticle R is held on a reticle stage RST. The position of the reticle stage RST can be determined with an interferometer 22 or other position determining device as known by one of ordinary skill. The reticle stage RST is driven with a reticle stage drive 10. An optical element G1 (not shown in FIG. 6) is placed under the reticle R. When the reticle stage RST is driven, the optical element G1 is scanned together with the reticle R. The circuit pattern image defined by the moving blind 7 in the slit illumination region 21 on the reticle R is projected through the projection optical system 13 onto the wafer W.

In a plain substantially perpendicular to the optical axis of the projection optical system 13, the scanning direction of the reticle R against the slit illumination region 21 is assumed to be a +X direction (or a −X direction). The direction substantially parallel to the optical axis of the projection optical system 13 is assumed to be a Z direction.

The reticle stage RST driven by the reticle stage drive 10 scans the reticle R in the scanning direction (+X direction or −X direction). The drives 6A and 6B for the moving blind 7 and drives for a non-scanning direction are controlled with a moving blind controller 11. The reticle stage drive 10 and the moving blind controller 11 are controlled with a main control system 12, which controls the whole device.

The wafer W is held on a wafer stage WST with a wafer conveyer (not shown). The wafer stage WST positions the wafer W in a plane substantially perpendicular to the optical axis of the projection optical system 13. The wafer stage WST includes an XY stage, which scans the wafer W in the ±X direction, and a Z stage, which positions the wafer W in the Z direction. The position of the wafer stage WST is determined with an interferometer 23. An off-axis alignment sensor 16 is placed over the wafer W. The alignment sensor 16 detects an alignment mark on the wafer. A detection signal is processed by a controller 17 and is sent to the main control system 12. The main control system 12 controls the positioning and the scanning of the wafer stage WST with a wafer stage drive 15.

When a pattern image on the reticle R is projected onto each shot area (i.e., the area illuminated on the wafer) on the wafer W through the projection optical system 13 by a scanning exposure process, the reticle R is scanned at a velocity VR in the −X direction (or +X direction) relative to the slit illumination region 21 defined by the field stop 5. In synchronism with the scanning of the reticle R, the wafer W is scanned in the +X direction (or −X direction) at a velocity of VW (=β×VR), wherein β denotes the magnification of the projection optical system 13. The pattern (e.g., circuit pattern) image of the reticle R is thus sequentially transferred to the shot areas on the wafer W.

An example of a major portion of an exposure apparatus according to the present exemplary embodiment is described below with reference to FIG. 5. An optical path space 120 under a final optical component 119 of projection optical system 101 in a housing (also referred to as body tube, casing, or holder) is surrounded by a shield 108 to reduce a chemical contaminant (hereinafter referred to as pollutant or contaminant). The shield 108 is provided with a gas supply portion 117. The optical path space 120 is maintained at positive pressure with a gas (for example, an inert gas, such as nitrogen) containing a low concentration of contaminants supplied from the gas supply portion 117. The gas from the gas supply portion 117 flows along the surface of the optical element 119 in the projection optical system 101. A rectifier 116 for rectifying a gas flow is disposed on the shield 108 opposite to the gas supply portion 117. The gas from the gas supply portion 117 (gas injector system) reaching the rectifier 116, is smoothly turned along the rectifier 116, and flows under the shield 108 in a downstream direction.

A gas inlet 111 supplies a cleaned and temperature-controlled gas from a gas-conditioning chamber (not shown). The gas from the gas-conditioning chamber can contain more contaminants than the gas from the gas supply portion 117 does. A gas exhaust port 110 disposed opposite to the gas inlet 111 returns the gas to the gas-conditioning chamber. The gas supplied from the gas supply portion 117 and flowing out from the shield 108 through the optical path space 120 is collected together with the gas from the gas inlet 111 and is exhausted from the gas exhaust port 110.

A wafer stage 118 holds and moves a wafer 102 and is controlled with a stage controller 103. A gas inlet valve 112 regulates the gas supply to the gas supply portion 117 and is controlled with a first environmental controller (environmental controller 1) 104. A shielding plate 114 reduces the entry of a gas flowing under the shield 108 into the optical path space 120. A gas exhaust port 109 (gas intake system) exhausts the gas flowing under the shield 108 in a downstream direction. A gas exhaust valve 115 regulates a gas from the gas exhaust port 109 and is controlled with a second environmental controller (environmental controller 2) 105. The stage controller 103, the first environmental controller 104, and the second environmental controller 105 are controlled with a main controller 106. A user interface (console) 107 is communicatably connected to the main controller 106. The user interface 107 presents information to a user and a user inputs a movement directive and other instructions through the user interface 107.

Figure 1:
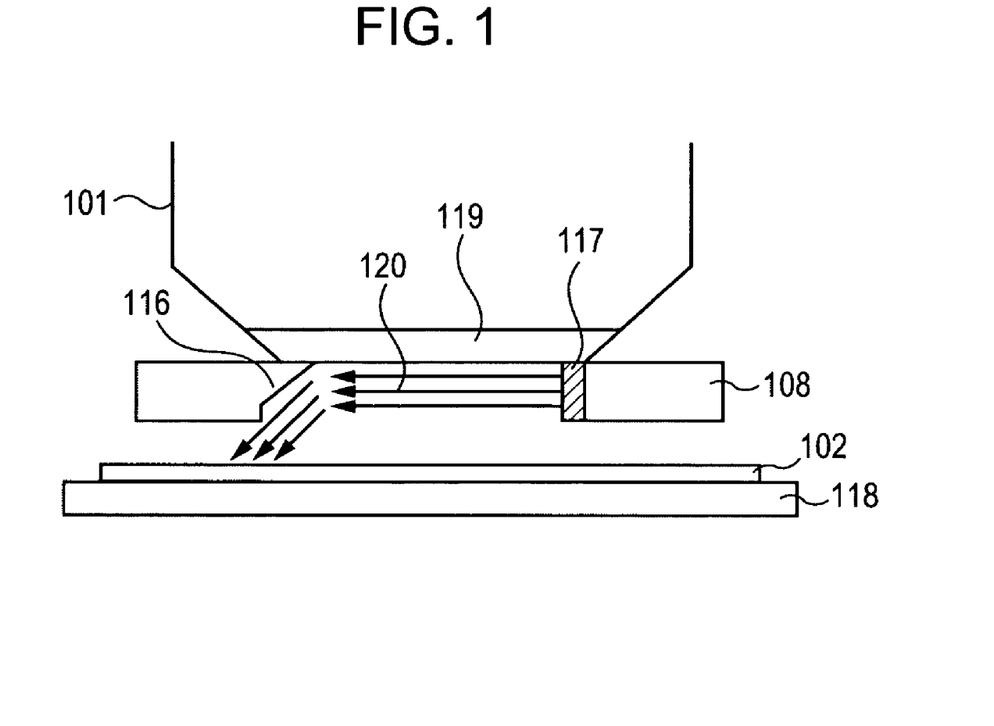
FIG. 1 is a schematic view of a major portion of an exposure apparatus according to a first exemplary embodiment.

A major portion of the exposure apparatus according to the first exemplary embodiment is further described in detail with reference to FIG. 1.

Figure 5:
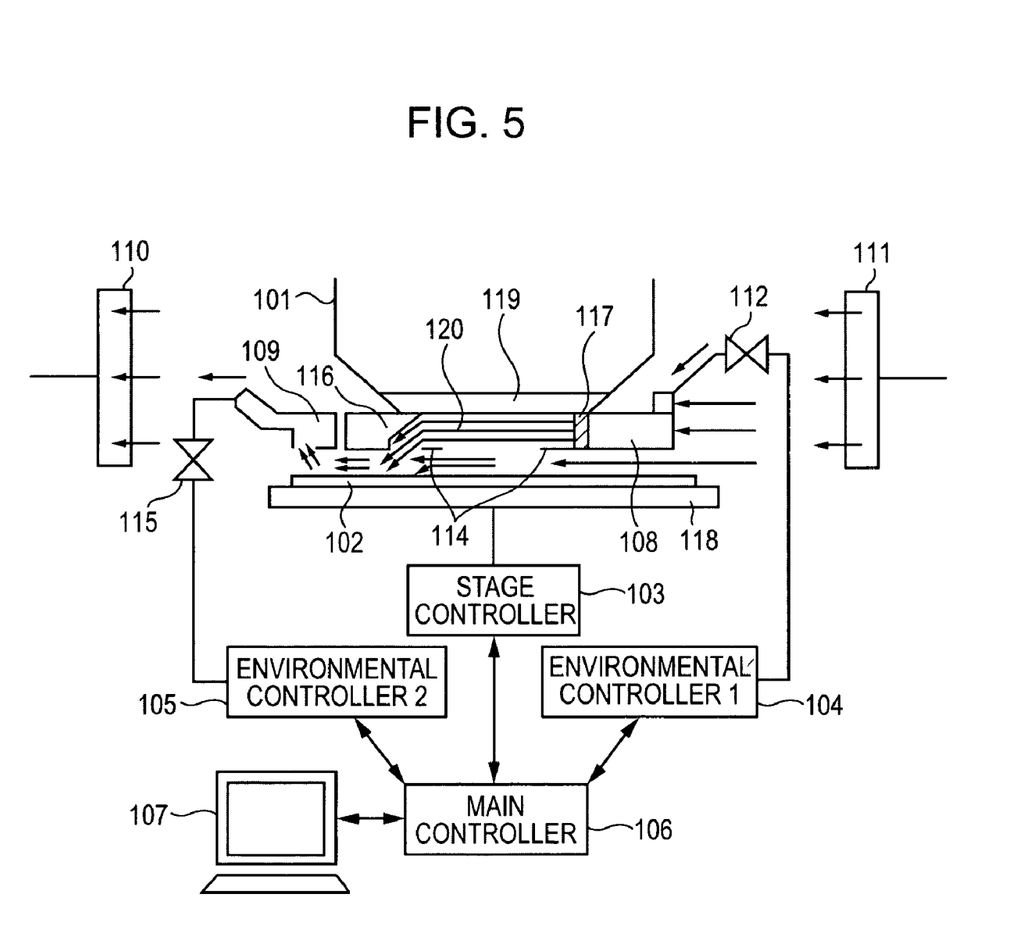
FIG. 5 is a schematic view of a major portion of an exposure apparatus according to the first exemplary embodiment.

A gas is supplied from the gas supply portion 117 of the shield 108 at the bottom of the projection optical system 101 through the gas inlet valve 112 (FIG. 5). The gas can be a clean gas, such as a clean inert gas (e.g., N2). If necessary, the temperature and/or the humidity of the gas can be adjusted. The gas can be a highly purified inert gas, such as nitrogen, helium, or argon. The gas can be cleaned air passed through a chemical filter to remove contaminants. An opening of the gas supply portion 117 can have almost the same width as the region through which exposure light passes. The opening can be arranged substantially parallel to the surface of the optical element 119. Arrows in FIG. 1 indicate the flow of a gas supplied to a space through which exposure light passes and the periphery of the space (hereinafter collectively referred to as optical path space 120). The gas flows along the surface of the optical element 119 in the projection optical system 101, can be smoothly turned along the rectifier 116 on the shield 108 opposite to the gas supply portion 117, and can flow in a downstream direction (to outside of the shield 108).

The positive pressure of the optical path space 120 relative to the ambient atmosphere (that is, the optical path space 120 can have a higher pressure than the ambient atmosphere) prevents or reduces contaminants (pollutants) from entering the optical path space 120 from the ambient atmosphere. To prevent or reduce contaminants from entering the optical path space 120, it is effective to provide no gas exhaust port in the optical path space 120 and to exhaust the gas supplied from the gas supply portion 117 from the shield 108 while the disturbance of the flow can be suppressed with the rectifier 116 disposed opposite to the gas supply portion 117.

A gas leaking from the optical path space 120 can be collected together with the gas from the gas inlet 111 and can be exhausted from the gas exhaust port 110 (FIG. 5).

The opening and closing and the degree of opening of the gas inlet valve 112 are controlled with the first environmental controller (environmental controller 1) 104. The gas inlet valve 112 is usually opened and therefore a gas is usually supplied to the optical path space 120 regardless of the position of the wafer stage 118. When the wafer stage 118 is separated from the optical path space 120, for example, owing to the replacement of the wafer 102 or the maintenance of the exposure apparatus, the supply of the gas can be stopped or decreased. After the replacement of the wafer 102 or the maintenance of the exposure apparatus, the supply of the gas can be resumed or increased before the wafer stage 118 is placed under the optical path space 120.

The present exemplary embodiment can be used when the shield 108 under the projection optical system 101 cannot surround the entire optical path space. When the shield 108 cannot surround the entire optical path space and therefore the optical path space can have an opening, a gas exhaust port in the optical path space 120 leads to the inflow of the outside gas from the opening, resulting in insufficient reduction of pollutants in the optical path space 120. Thus, the optical path space 120 can have no gas exhaust port. The gas is exhausted from the optical path space 120 while the disturbance of the gas flow is suppressed with the rectifier (inclination) 116 on the shield 108. In addition, the optical path space 120 is held under a positive pressure. This reduces pollutants in the optical path space 120.

Second Exemplary Embodiment

Figure 2:
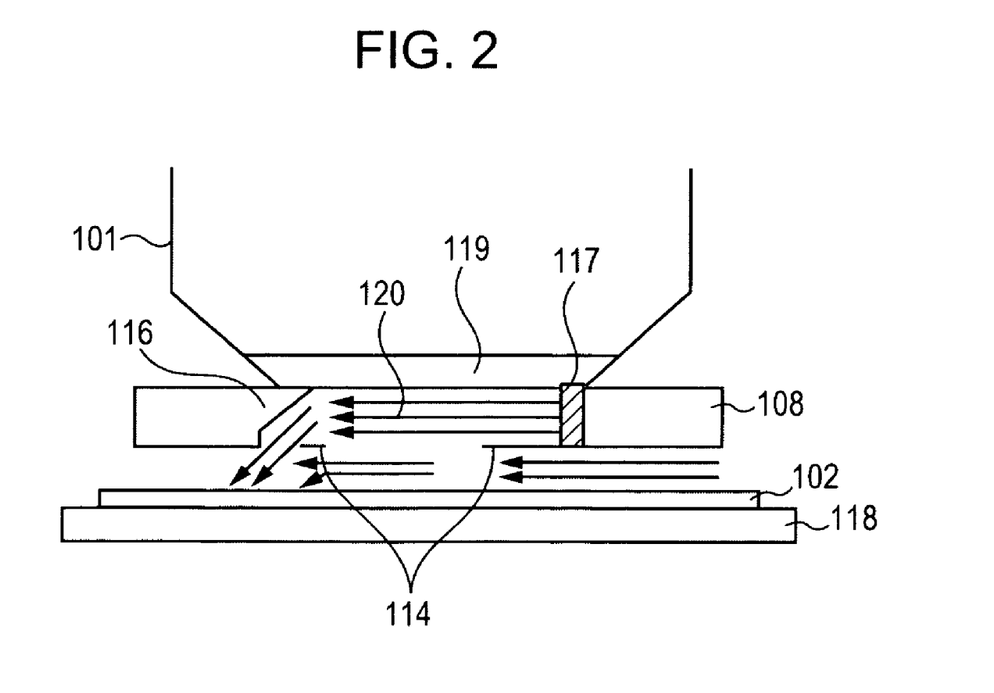
FIG. 2 is a schematic view of a major portion of an exposure apparatus according to a second exemplary embodiment.

FIG. 2 illustrates a major portion of an exposure apparatus according to a second exemplary embodiment.

When the movement of the wafer stage 118 disturbs the gas flow in the ambient atmosphere, a gas between the shield 108 and the wafer 102 can be raised and flow into the optical path space 120. The present exemplary embodiment differs from the first exemplary embodiment in that the structure according to the present exemplary embodiment reduces the entry of a gas flowing under the shield 108 into the optical path space 120.

To reduce the entry of the gas flowing under the shield 108 into the optical path space 120, a shielding plate 114 is provided for reducing the contamination with the ambient gas. The shielding plate 114 can be placed under the optical path space 120 and in at least one region that does not interfere with the gas supply from the gas supply portion 117, the rectifying action of the rectifier 116, and the passages of exposure light and measurement light. The shielding plate 114 can reduce the entry of the ambient gas into the optical path space due to the movement of the wafer stage 118.

Third Exemplary Embodiment

Figure 3:
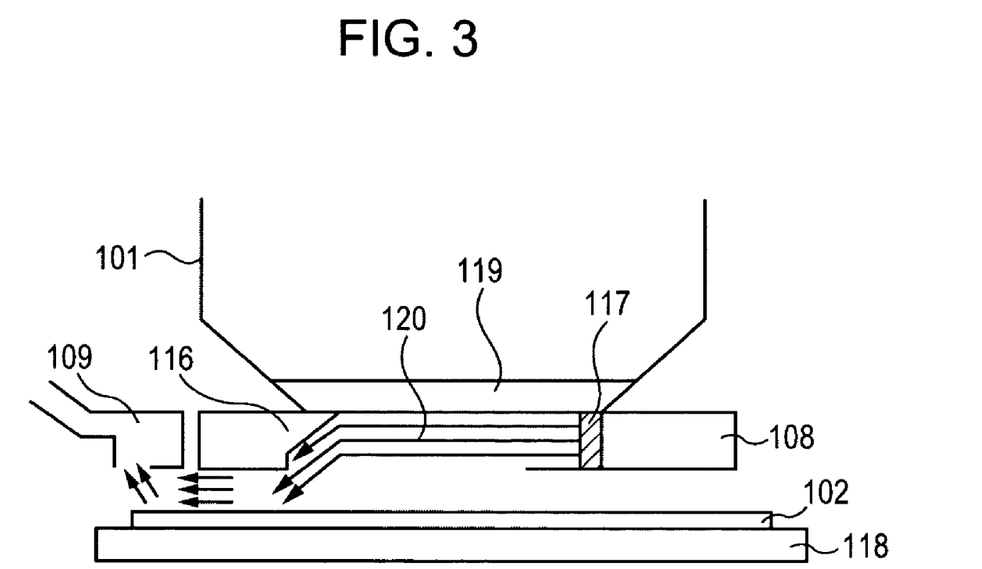
FIG. 3 is a schematic view of a major portion of an exposure apparatus according to a third exemplary embodiment.

FIG. 3 illustrates a major portion of an exposure apparatus according to a third exemplary embodiment.

The present exemplary embodiment differs from the first exemplary embodiment in that a gas exhaust port 109 is provided in a downstream region of an exposed area on a wafer (a downstream region of the flow of the ambient gas and a downstream region of the flow of a gas supplied from the gas supply portion 117), that is, a source of a gas generated from a photoresist applied on the wafer upon exposure (resist outgas), and in a region outside of the shield 108 insulating the optical path space 120.

The width of the gas exhaust port 109 can be determined by calculating the diffusion area of the resist outgas from the diffusion coefficient of the resist outgas and the speed of the gas flow. The wafer stage 118 can move in the direction of X-, Y- and Z-axes and rotate on the X-, Y- and Z-axes, where the Z-axis is the optical axis of the projection optical system. Thus, it is difficult to place the gas exhaust port horizontally in the vicinity of the top surface of the wafer in the downstream region of a resist outgas source. Thus, the gas exhaust port 109 is placed above the top surface of the wafer in the downstream region of the resist outgas source. The gas exhaust port 109 can have an opening in a downward direction or in a diagonally downward direction (that is, the gas exhaust port is placed such that a line substantially perpendicular to the opening plane can have a component of the optical axis direction of the optical system). This allows efficient exhaustion of the resist outgas.

The opening and closing and the degree of opening of the gas inlet valve 112 and the gas exhaust valve 115 are controlled with the first environmental controller (environmental controller 1) 104 and the second environmental controller (environmental controller 2) 105, respectively. The gas inlet valve 112 and the gas exhaust valve 115 are usually opened. Thus, a gas is usually supplied to the optical path space 120 and is exhausted at a downstream region from the optical path space 120, regardless of the position of the wafer stage 118. When the wafer stage 118 is separated from the optical path space 120, for example, owing to the replacement of the wafer 102 or the maintenance of the exposure apparatus, the supply of the gas can be stopped or decreased. After the replacement of the wafer 102 or the maintenance of the exposure apparatus, the supply of the gas can be resumed or increased before the wafer stage 118 is placed under the optical path space 120.

The gas from the gas exhaust port 109 is exhausted outside of the device. This prevents or reduces the resist outgas from entering a gas circulating system in the device and extends the useful life of a chemical filter. This can also reduce chemical contaminants in the device.

Fourth Exemplary Embodiment

Figure 4:
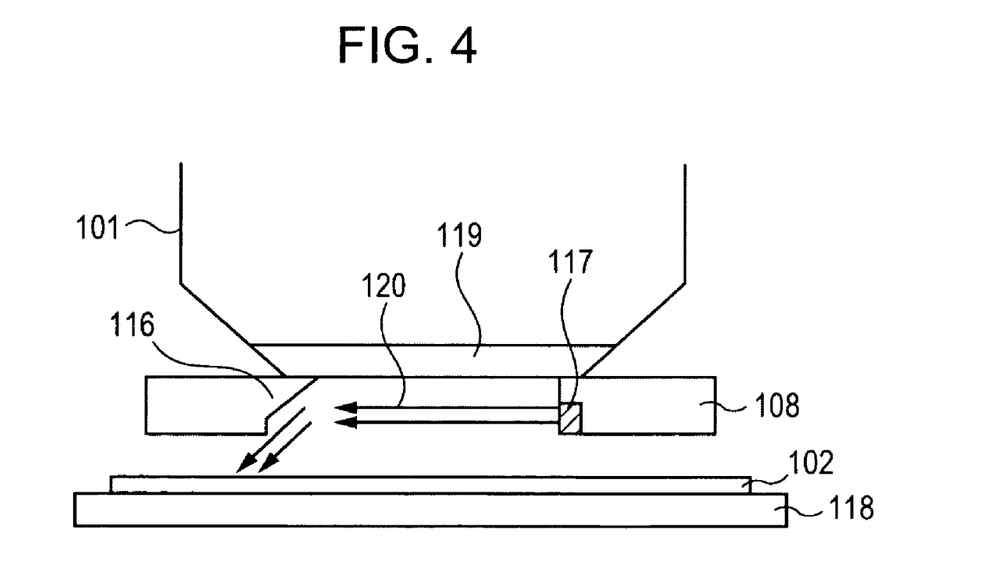
FIG. 4 is a schematic view of a major portion of an exposure apparatus according to a fourth exemplary embodiment.

FIG. 4 illustrates a major portion of an exposure apparatus according to a fourth exemplary embodiment.

This embodiment differs from the first exemplary embodiment in that the gas supply portion 117 for supplying a gas to the optical path space 120 is placed a predetermined distance apart from the surface of the optical element 119 in the projection optical system 101. Higher gas flow rate on the surface of the optical element 119 results in higher deposition rate of a chemical contaminant. Thus, the positive pressure of the optical path space 120 and lower gas flow rate on the surface of the optical element 119 can prevent or reduce the deposition of a chemical contaminant on the optical element 119.

While exemplary embodiments are applied to the optical path space between the last surface of the projection optical system and the wafer stage, the present invention is not limited to this and can be applied to other optical path spaces, such as an optical path space between the first surface of the projection optical system and a reticle stage and an optical path space between the last surface of an illumination optical system and a reticle stage.

A process for manufacturing a semiconductor device is described below as an exemplary process for manufacturing a device utilizing at least one of the exposure apparatus described above.

Figure 7:
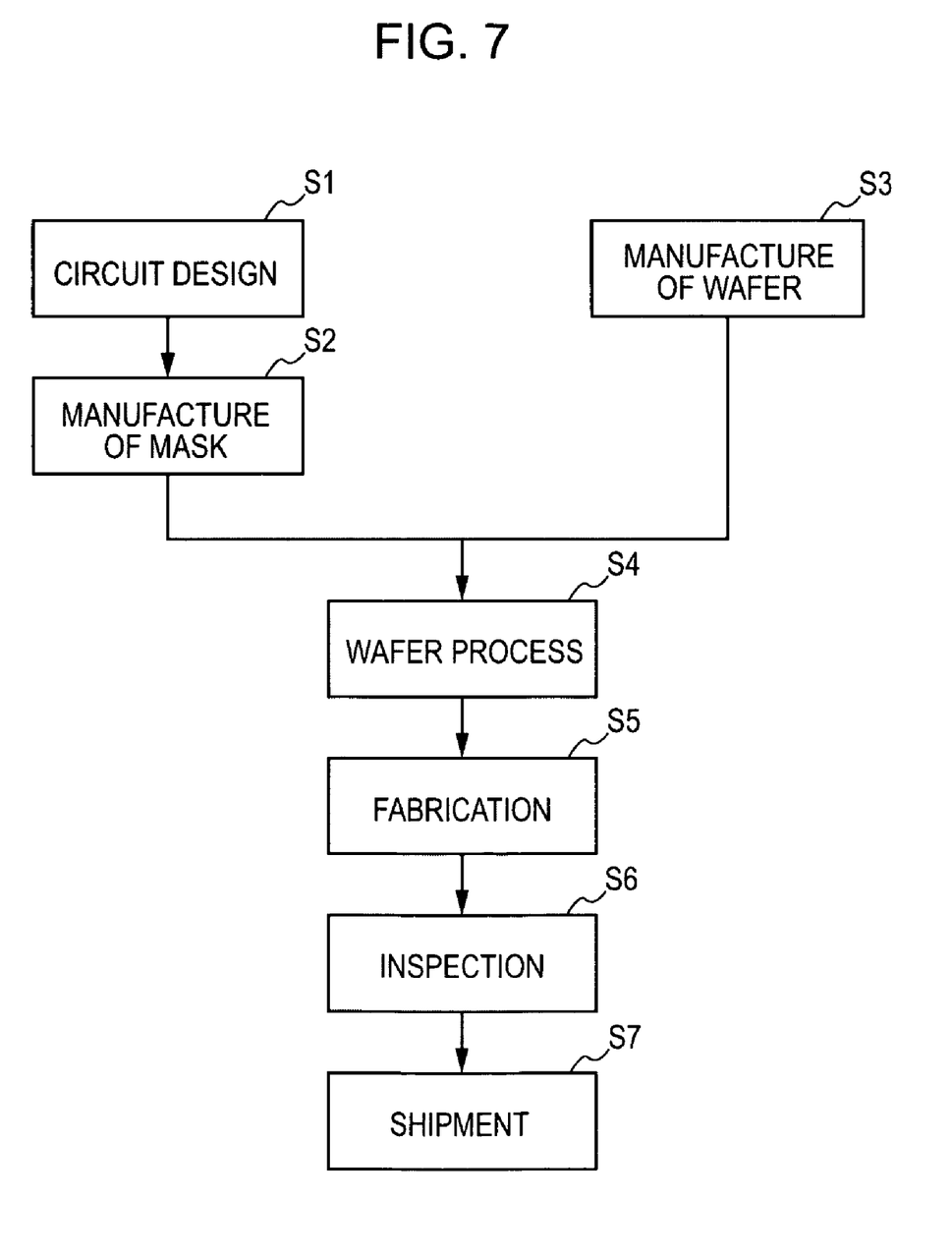
FIG. 7 is a flow chart of a process for manufacturing a semiconductor device.

FIG. 7 is a flow chart of a whole process for manufacturing a semiconductor device. In step S1 (circuit design), the circuitry of the semiconductor device is designed. In step S2 (manufacture of mask), a mask is manufactured according to the designed circuit pattern. In step S3 (manufacture of wafer), a wafer is manufactured, for example, from silicon. In step S4 (wafer process) called a front-end process, a circuit is formed on the wafer by lithography using the mask and the wafer. In step S5 (fabrication) called a post process, semiconductor chips are manufactured from the wafer manufactured in step S4. Step S5 involves fabrication processes, such as an assembly process (dicing and bonding) and a packaging process (encapsulation of chip). In step S6 (inspection), a semiconductor device manufactured in step S5 is subjected to an operational verification test, a durability test, and other tests. A finished semiconductor device by performing these processes is shipped (step S7).

Figure 8:
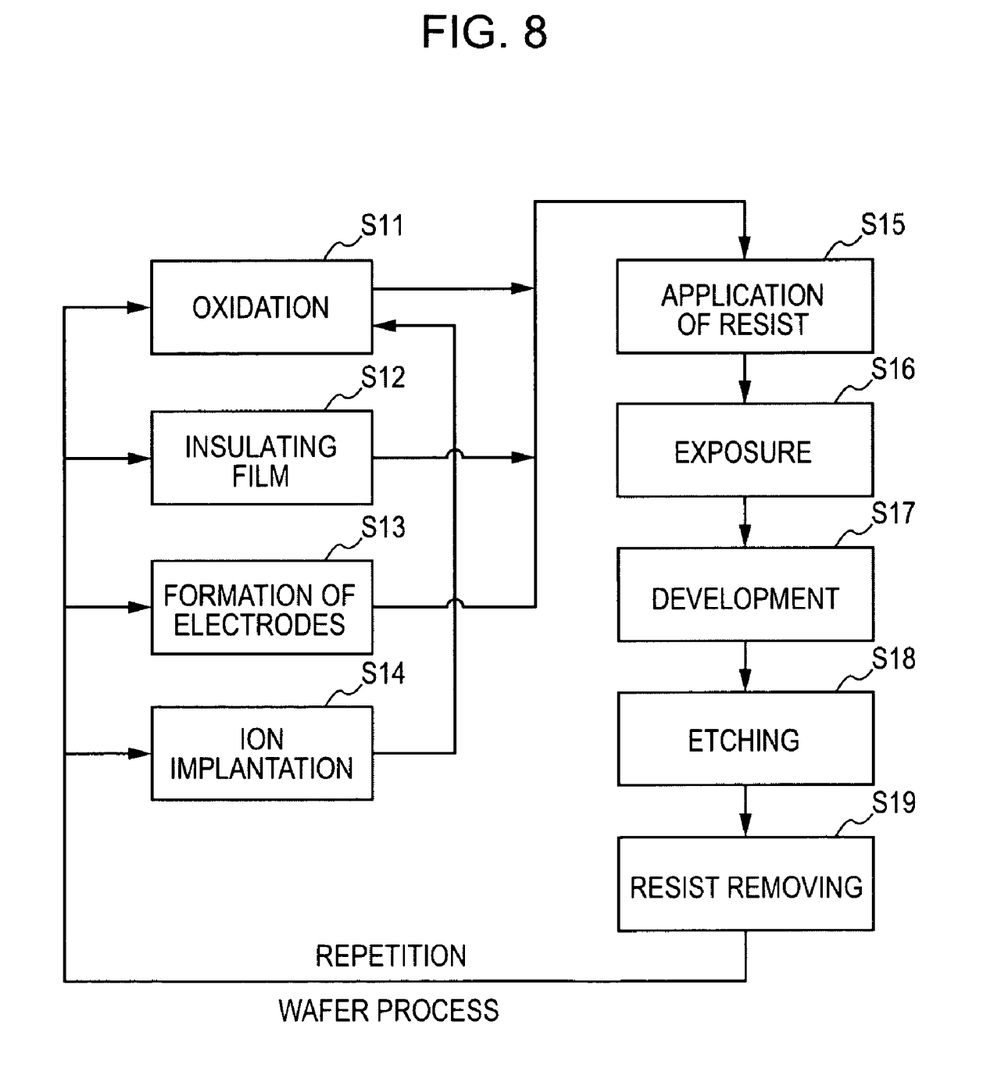
FIG. 8 is a detailed flow chart of a wafer process illustrated in FIG. 7.

FIG. 8 is a detailed flow chart of the wafer process illustrated in FIG. 7. In step S11 (oxidation), the surface of a wafer is oxidized. In step S12 (e.g., CVD), an insulating film is formed on the wafer. In step S13 (formation of electrodes), electrodes are formed on the wafer by vapor deposition. In step S14 (ion implantation), ions are implanted in the wafer. In step S15 (application of resist), a photosensitizer is applied to the wafer. In step S16 (exposure), a circuit pattern is transferred with an exposure apparatus to the wafer to which the photosensitizer is applied to form a latent image pattern. In step S17 (development), the latent image pattern formed on the photosensitizer on the wafer is developed. In step S18 (etching), etching is performed using a pattern formed by the development as a mask. In step S19 (resist removing), unnecessary resist after the etching is removed. Repetition of these steps forms multiple circuit patterns on the wafer.

According to the exemplary embodiments, a novel technique for reducing the contamination of the surface of an optical element is provided.

The present invention is not limited to the above exemplary embodiments and various changes and modifications can be made within the spirit and scope of the present invention.

This application claims priority from Japanese Patent Application No. 2005-060652, entitled "exposure apparatus and method for manufacturing device" and filed on Mar. 4, 2005, the entire contents of which are incorporated herein by reference in its entirety.

What is claimed is:

1. An exposure apparatus for exposing a substrate to light through an original plate, said apparatus comprising:

an optical system disposed on an optical path between a light source and the substrate;

a casing configured to accommodate said optical system;

a shield configured to surround an optical path space adjacent to an end face of said optical system accommodated in said casing;

a gas supply system configured to supply gas into the optical path space surrounded by said shield from a first region of said shield toward a second region of said shield, the second region facing the first region;

a rectifier disposed in the second region and configured to deflect flow of the gas supplied by said gas supply system and to direct the flow outside of said shield, the rectifier having a slope inclined in such a way that an end portion of the slope on the side of the substrate is farther away from the first region than an end portion of the slope on the side of the system; and a shield plate attached to the shield on the side of the substrate and configured to reduce the flow of gas from outside of the optical path space.

2. An apparatus according to claim 1, wherein said gas supply system is configured to supply one of air filtered by a filter and inert gas to the optical path space.

3. An apparatus according to claim 1, further comprising a gas exhaust system including a gas exhaust port disposed outside of said shield and downstream of the flow.

4. An apparatus according to claim 3, wherein said gas exhaust port is disposed such that a direction of a normal with respect to a plane of an opening of said gas exhaust port is at an angle less than a right angle with a direction of an optical axis of said optical system.

5. An apparatus according to claim 1, wherein a gas supply port of said gas supply system is disposed with a gap from the end face of said optical system in a direction of an optical axis of said optical system.

6. An apparatus according to claim 1, wherein said optical system is a projection optical system configured to form an image of a pattern of the original plate on the substrate, and the end face is one of the first surface and the last surface of said projection optical system.

7. An apparatus according to claim 1, wherein said optical system is an illumination optical system configured to illuminate a pattern of the original plate, and the end face is the last surface of said illumination optical system.

* * * * *